(12) United States Patent
Lavoie et al.

(10) Patent No.: US 8,251,594 B2
(45) Date of Patent: Aug. 28, 2012

(54) PLUGGABLE ELECTRONIC UNIT WITH TRANSMISSION POWER ADJUSTMENT CAPABILITY

(76) Inventors: Renaud Lavoie, Laval (CA); Eric Dudemaine, Crabtree (CA)

( * ) Notice: Subject to any disclaimer, the term of this patent is extended or adjusted under 35 U.S.C. 154(b) by 315 days.

(21) Appl. No.: 12/756,224

(22) Filed: Apr. 8, 2010

(65) Prior Publication Data

US 2011/0249408 A1 Oct. 13, 2011

(51) Int. Cl.
*G02B 6/36* (2006.01)
*H01R 33/945* (2006.01)
*H04B 10/08* (2006.01)
*H05K 7/00* (2006.01)

(52) U.S. Cl. ........... 385/92; 385/88; 385/53; 439/577; 398/15; 398/25; 398/30; 398/32; 398/38; 398/135; 398/139; 361/728

(58) Field of Classification Search .............. 385/12, 385/53, 139, 122, 123, 92, 88, 140; 439/577; 398/15, 11, 25, 26, 27, 28, 29, 30, 31, 32, 398/33, 38, 135, 136, 137, 138, 139; 361/728
See application file for complete search history.

(56) References Cited

U.S. PATENT DOCUMENTS

| 6,744,964 | B1 * | 6/2004 | Vittal ............................... 385/140 |
| 7,664,401 | B2 * | 2/2010 | Nelson et al. .................. 398/138 |
| 8,000,607 | B2 * | 8/2011 | Hsieh ............................. 398/135 |
| 2006/0159460 | A1 * | 7/2006 | Stewart et al. ................ 398/135 |
| 2006/0165417 | A1 * | 7/2006 | Hsieh ............................. 398/138 |
| 2010/0052863 | A1 * | 3/2010 | Renfro et al. ................ 340/10.4 |
| 2011/0249408 | A1 * | 10/2011 | Lavoie et al. ................. 361/728 |

OTHER PUBLICATIONS

SFF Committee "SFF-8431 Specifications for Enhanced Small Form Factor Pluggable Module SFP+", Revision 4, Jul. 6, 2009.

* cited by examiner

*Primary Examiner* — Brian Healy

(57) ABSTRACT

The present relates to pluggable electronic unit with transmission power adjustment capability such as for example small form-factor pluggable transceivers. The pluggable electronic unit with transmission power adjustment capability may comprise a power adjustment unit. By verifying the transmitted power is sufficient or could be reduced, it is possible to regulate transmission power of a transceiver autonomously within the pluggable electronic unit itself.

18 Claims, 3 Drawing Sheets

PLUGGABLE ELECTRONIC UNIT WITH TRANSMISSION POWER ADJUSTMENT CAPABILITY

The present relates to the field of pluggable electronic units and more particularly to a pluggable electronic unit with transmission power adjustment capability.

BACKGROUND

With the increase of prices for energy, many industries have revisited their power consumption so as to find solutions to reduce their energy consumption. In the past, many electrical and electronic systems were designed without much consideration to energy consumption. As some of these electrical and electronic systems come to their life end, they are being replaced with systems with lesser energy consumptions.

In various areas such as video broadcast industry and telecommunication industry, the electronic systems used are composed of frames in which multiple electronic components, also called pluggable units, are inserted in and plugged thereto. The general approach used to reduce energy consumption in these areas has been to add to the frames an energy controlling unit. The energy controlling unit monitors the overall energy consumption, and when some of the pluggable units are in idle state, reduces the energy provided. Although this approach is not convenient and efficient. First, to be able to determine when the pluggable units are in idle state, the energy controlling unit must be adapted for monitoring the state of those pluggable units. Various types of pluggable units, from different manufacturers with various proprietary characteristics may be plugged within a single frame, rendering it nearly impossible for a manufacturer of the energy controlling unit to monitor all possibilities of pluggable units. Thus the energy controlling unit typically controls energy consumption of a portion of the pluggable units, and not all. In addition, to perform such monitoring, the energy controlling unit must itself consume energy. Finally, the installation and maintenance of the energy controlling unit in proper functioning with the various pluggable units is tedious and costly, as it requires additional work from a technician.

For those reasons, there is a need for a device that alleviates the aforementioned problems.

DETAILED DESCRIPTION

Figure 1:
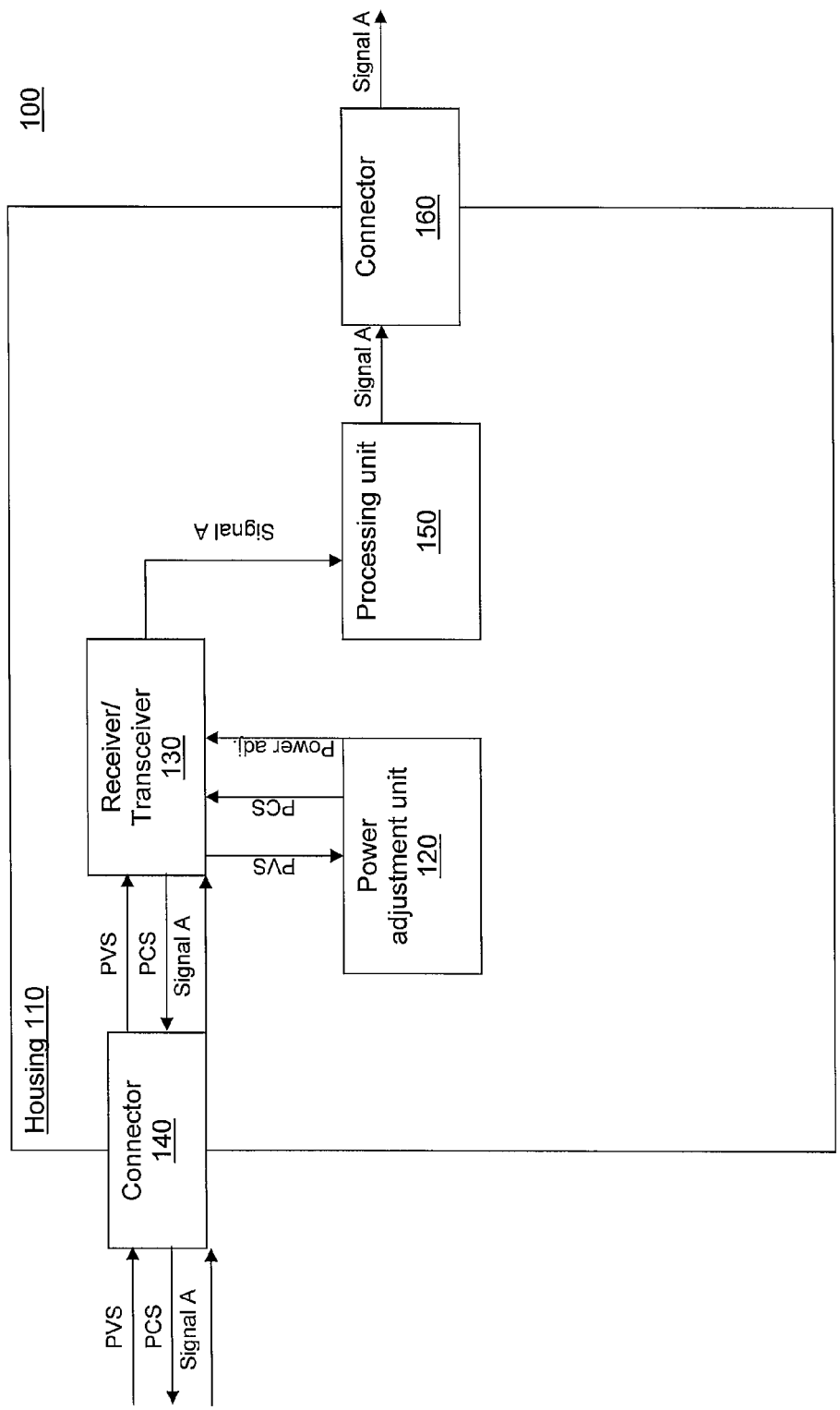
FIG. 1 is schematic representation of a pluggable electronic unit with transmission power adjustment capability in accordance with an aspect.

The foregoing and other features of the present pluggable electronic unit with transmission power adjustment capability will become more apparent upon reading of the following non-restrictive description of examples of implementation thereof, given by way of illustration only with reference to the accompanying drawings. In the drawings, similar references denote like parts.

The present relates to pluggable electronic unit such as for example small form-factor pluggable transceiver. In a first aspect, the present pluggable electronic unit with transmission power adjustment capability comprises a housing adapted for insertion in a corresponding frame, and a power adjustment unit located in the housing. The power adjustment unit is adapted for measuring at least one characteristic of a power verification signal (PVS) and generating a corresponding power confirmation signal (PCS).

In another aspect, the present relates to a pluggable electronic unit with transmission power adjustment capability comprises a housing, a transceiver and a power adjustment unit. The housing is adapted to be inserted in a corresponding frame. The transceiver is adapted for receiving a power confirmation signal, and for transmitting data and a power verification signal. The power adjustment unit is adapted for adjusting transmission power of the transceiver for transmitting the data based on the received power confirmation signal.

In yet another aspect, the present pluggable electronic unit with transmission power adjustment capability comprises a housing, a first transceiver, a second transceiver and a power adjustment unit. The housing is adapted to be inserted in a corresponding frame. The first transceiver is adapted for receiving a first data signal and a power verification signal. The first transceiver is further adapted for transmitting a power confirmation signal. The second transceiver is adapted for receiving another power confirmation signal and for transmitting a second data signal and another power verification signal. The power adjustment unit is adapted for measuring at least one characteristic of the power verification signal and generating there from the power confirmation signal. The power adjustment unit is also adapted for adjusting transmission power of the second transceiver for transmitting the second data signal based on power information provided in the another power confirmation signal.

Reference is now made to FIG. 1, which depicts an exemplary schematic representation of the present pluggable electronic unit with transmission power adjustment capability in accordance with an aspect. The pluggable electronic unit 100 is adapted to be installed within a housing 110. The housing 110 may be of standardized dimensions, and is adapted to be mounted into a corresponding frame (not shown). Examples of standard dimensions for the housing comprise: small form-factor pluggable (SFP) transceiver; SFP+, 10 Gigabit SFP, X2, Xenpak, GPON SFP, CFP or any other type of small form-factor pluggable related standard, etc. The housing 110 is for example, of the type used for various video broadcasting and telecommunications network equipments.

The pluggable electronic unit 100 further comprises a power adjustment unit 120. The power adjustment unit 120 is located within the housing 110, and is adapted for measuring one or several characteristics of a power verification signal (shown as PVS). The power verification signal may be a dedicated signal (as shown on FIG. 1), a copy of a portion of received signal (shown as signal A), embedded within signal A, measured directly from signal A, a standardized signal or a proprietary signal. For graphical representation simplicity only, the power verification signal and signal A are depicted as distinct signals, but are not limited to such an implementation. The power adjustment unit 120 measures one or several of the following characteristics of the power verification signal: bit-error rate, power strength, distance of link, reflection, attenuation, light chromatic dispersion, light polarization attenuation, light polarization dispersion, signal to noise ratio, or any other characteristic indicative of the quality of the power verification signal. Based on the measured characteristic(s), the power adjustment unit 120 generates a corresponding power confirmation signal (represented as PCS). For example, if the power adjustment unit 120 measures a bit error rate higher than acceptable, the power adjustment unit 120 generates the power confirmation signal indicating that transmission power of signal A should be increased. More precisely, the power confirmation signal comprises power information for another pluggable electronic unit with transmission power adjustment capability transmitting signal A. In the event that the power adjustment unit 120 determines that the bit error rate is lower than a predetermined threshold, or the power strength is higher than required, or any other characteristic or combination thereof indicates that the transmission signal for signal A could be reduced, the power adjustment unit 120 generates the power confirmation signal indicative of such recommended reduced transmission power.

Additionally, the power adjustment unit 120 may further be adapted for determining, based on the measured characteristics, adjustments to be introduced to the receiver/transceiver 130 such as for example on the equalization thereof. For doing so, the power adjustment unit 120 generates and sends a power adjustment signal to the receiver/transceiver 130 to indicating that one or several parameters of the receiver/transceiver 130 may be adjusted.

By monitoring the quality of the power verification signal at the power adjustment unit 120, it is thus possible to determine when transmission power for the corresponding signal A may be reduced and increased. Such power regulation allows for better power management from and to the pluggable electronic unit 100 with transmission power adjustment capability. As transmission power is directly related to power consumption and heat generation, regulating the transmission power so as to be sufficient for a relatively good quality for signal A directly improves power consumption and reduces heat generation. Furthermore, by adjusting the parameters of the receiver/transceiver 130 by means of the power adjustment signal, it is possible to further reduce power consumption of the receiver/transceiver 130.

The receiver/transceiver 130 is adapted for receiving the power verification signal, signal A and for transmitting the power confirmation signal. Typically, the receiver/transceiver 130 receives the power verification signal and signal A, and transmits the power confirmation signal by means of a connector 140. The receiver/transceiver 130 is adapted to be inserted within the housing 110. The connector 140 may include any of the following: optical connector, coaxial connector, antenna, or any type of electrical connector.

Then, signal A may optionally be provided to a processing unit 150. The processing unit 150 is adapted for processing signal A, and then providing the processed signal A to a connector 160. Various types of processing may be performed by the processing unit 150: equalizing, signal transformation, re-clocking, driving, signal reshaping, signal reconditioning, synchronizing, buffering, delaying, formatting, packetizing, amplifying, and any other type of required action that may be performed on signal A. The connector 160 may consist of any type of electrical or electronic connector known in the industry.

Although only one receiver/transceiver 130 has been depicted in FIG. 1, it is possible for the pluggable electronic unit 100 to comprise one or several transceivers 130 operating in receiving mode and in communication with the processing unit 150.

Figure 2:
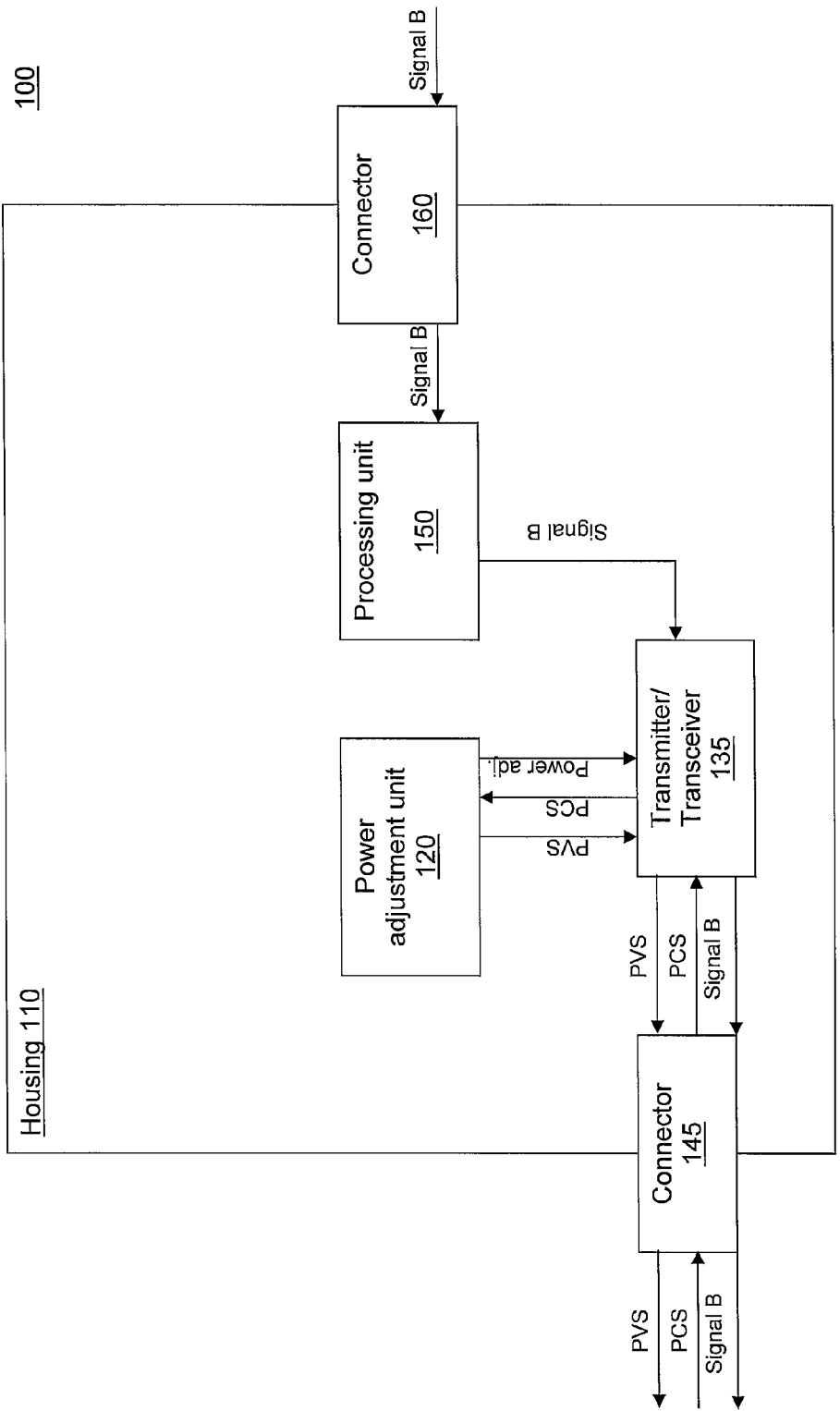
FIG. 2 is a schematic representation of a pluggable electronic unit with transmission power adjustment capability in accordance with another aspect.

Reference is now made to FIG. 2, which depicts a schematic representation of the pluggable electronic unit 100 in accordance with another aspect. In the previously discussed aspect, the receiver/transceiver 130 acted in receiving mode wherein the pluggable electronic unit 100 monitored the power verification signal, so as to determine whether the transmission power of a transmitting unit and parameters of the receiver/transceiver 130 should be modified, and informed the latter of the required or possible modification to its transmission power and receiving mode. In the present aspect, the transmitter/transceiver 135 acts in transmission mode, wherein the pluggable electronic unit 100 receives, via a connector 145, an indication (PCS) from another pluggable unit that its transmission power can or should be modified. For doing so, the pluggable electronic unit 100 generates the power verification signal by means of the power adjustment unit 120. The power verification signal is transmitted by the transmitter/transceiver 135 to another receiving unit to which signal B is transmitted by the pluggable electronic unit 100. The transmitter/transceiver 135 is also adapted for receiving the power confirmation signal. The received power confirmation signal is received by the transmitter/transceiver 135 and redirected to the power adjustment unit 120. Upon receipt of the power confirmation signal, the power adjustment unit 120 determines based on its content whether the transmission power of the transmitter/transceiver 135 could or should be modified. For example, if the power confirmation signal indicates that signal B could be transmitted with less power, the power adjustment unit 120 instructs the transmitter/transceiver 135 by means of a power adjustment message (shown as Power adj.), thereby adjusting the transmission power of the transmitter/transceiver 135.

Although FIG. 2 depicts a pluggable electronic unit 100 comprising only one transmitter/transceiver 135 operating in transmission mode, the latter is not limited to such an implementation. For example, the pluggable electronic unit 100 could comprise several transceivers 135 in transmission mode, each for transmitting one signal received from the processing unit 150, or distinct signals received from the processing unit 150.

Figure 3:
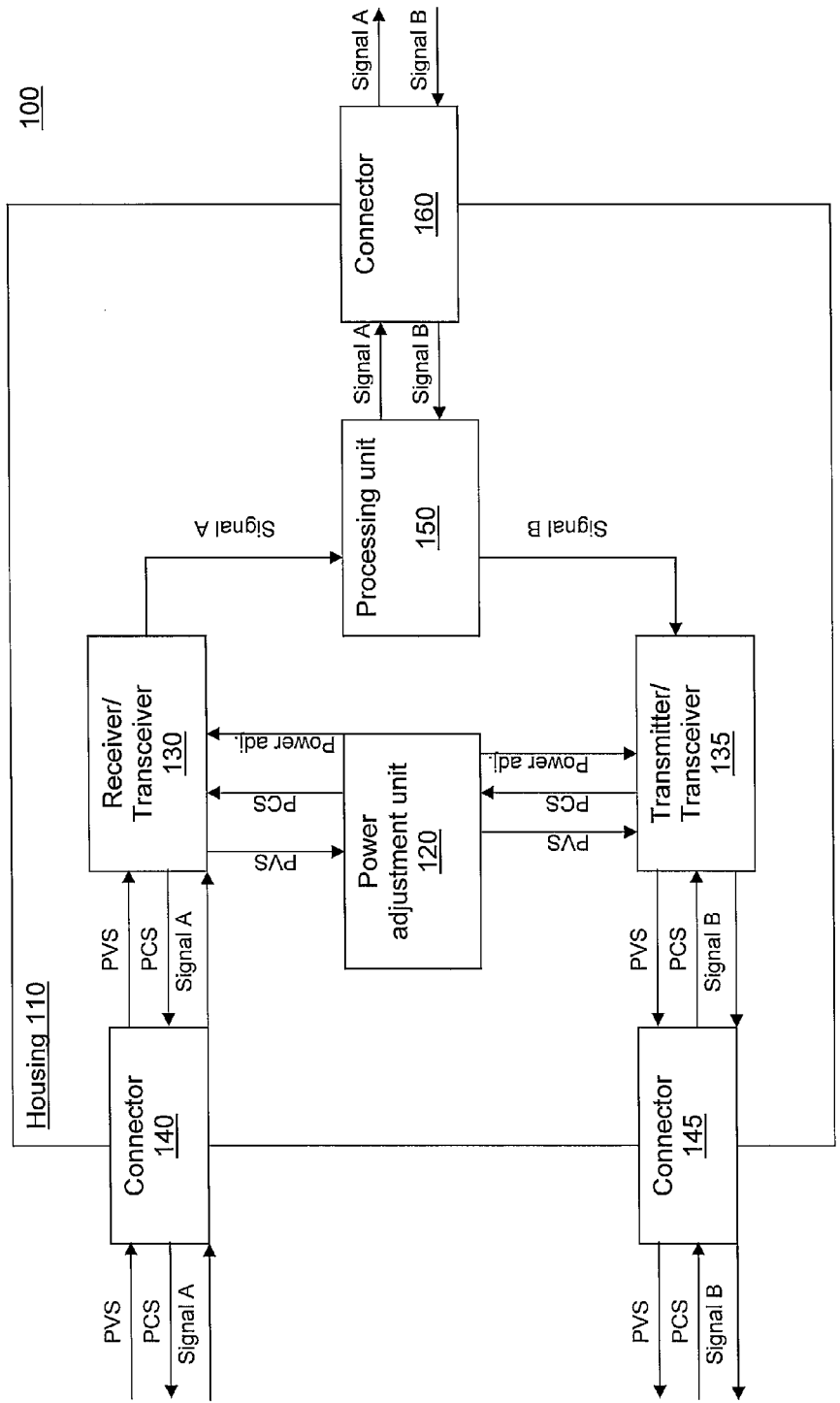
FIG. 3 is a schematic representation of a pluggable electronic unit with transmission power adjustment capability in accordance with yet another aspect.

Reference is now made to FIG. 3, which schematically depicts another aspect of the pluggable electronic unit 100. In this other aspect, the pluggable electronic unit 100 performs the dual functions previously depicted in FIGS. 1 and 2, and as previously described. More particularly, the pluggable electronic unit 100 comprises at least one receiver/transceiver 130 in reception mode, and at least one transmitter/transceiver 135 in transmission mode. Alternately, the receiver/transceiver 130 in reception mode and the transmitter/transceiver 135 in transmission mode could be implemented as a single transceiver capable of both reception of a signal and transmission of another signal through one single connector.

Thus, by monitoring and adjusting the transmitting power for signal A and signal B and the receiving parameters of the receiver/transceiver 130, it is possible to efficiently autonomously and independently manage power used by the pluggable electronic unit 100.

The power verification signals and power confirmation signals described could be proprietary signals, standardized signals, or embedded within standardized signals. The power confirmation signals could comprise specific information such as for example: an indication that the transmission power can be reduced, a measured power for the received signal, a received bit error rate, or any other appropriate indication for regulating the transmission power.

The expressions receiver/transceiver and transmitter/transceiver have been used herein to respectively refer to a receiver capable of receiving and transmitting signals, and to a transmitter capable of both transmitting and receiving signals.

Although the present pluggable electronic unit with transmission power adjustment capability has been described in the foregoing description by way of illustrative embodiments thereof, these embodiments can be modified at will, within the scope of the appended claims.

What is claimed is:

1. A pluggable electronic unit with transmission power adjustment capability comprising:
   a housing adapted to be mounted in a corresponding frame;
   a power adjustment unit located in the housing and adapted for measuring at least one characteristic of a power verification signal and generating a corresponding power confirmation signal; and
   a connector operably connected to the power adjustment unit for inputting the power verification signal into the housing or for outputting the power confirmation signal from the housing.

2. The pluggable electronic unit with transmission power adjustment capability of claim 1, further comprising:
   a transceiver for receiving the power verification signal and a data signal;
   wherein the power confirmation signal comprises power adjustment information for another pluggable electronic unit with transmission power adjustment capability.

3. The pluggable electronic unit with transmission power adjustment capability of claim 1, wherein the standardized dimensions correspond to one of the following: small form-factor pluggable (SFP) transceiver; SFP+, 10 Gigabit SFP, X2, Xenpak, GPON SFP,CFP or any other type of small form-factor pluggable related standard.

4. The pluggable electronic unit with transmission power adjustment capability of claim 2, wherein the transceiver comprises a connector.

5. The pluggable electronic unit of claim 1, wherein the at least one characteristic of the power verification signal consists of at least one of the following: a bit-error rate, power strength, distance of link, reflection, attenuation, light chromatic dispersion, light polarization attenuation, light polarization dispersion, signal to noise ratio, or any other characteristic indicative of the quality of the power verification signal.

6. The pluggable electronic unit with transmission power adjustment capability of claim 4, wherein the connector consists of one of the following: optical connector, coaxial connector, electrical connector or an antenna.

7. A pluggable electronic unit with transmission power adjustment capability comprising:
   a housing of standardized dimensions adapted to be mounted in a corresponding frame;
   a transceiver adapted for receiving a power confirmation signal and for transmitting data and a power verification signal;
   a power adjustment unit located in the housing, the power adjustment unit being adapted for adjusting transmission power of the transceiver for transmitting the data based on the received power confirmation signal; and
   a connector connected to the transceiver for inputting the power confirmation signal into the housing or for outputting the power verification signal from the housing.

8. The pluggable electronic unit with transmission power adjustment capability of claim 7, wherein the housing is of standardized dimensions corresponding to one of the following: small form-factor pluggable (SFP) transceiver; SFP+, 10 Gigabit SFP, X2, Xenpak, GPON SFP,CFP, or any other type of small form-factor pluggable related standard.

9. The pluggable electronic unit with transmission power adjustment capability of claim 7, wherein the transceiver further comprises a connector.

10. The pluggable electronic unit with transmission power adjustment capability of claim 9, wherein the connector consists of one of the following: optical connector, coaxial connector, electrical connector or an antenna.

11. A pluggable electronic unit with transmission power adjustment capability comprising:
   a housing adapted to be mounted in a corresponding frame;
   a first transceiver adapted for receiving a first data signal and a power verification signal, and for transmitting a power confirmation signal;
   a second transceiver adapted for receiving another power confirmation signal and for transmitting a second data signal and another power verification signal;
   a power adjustment unit adapted for measuring at least one characteristic of the power verification signal, for generating there from the power confirmation signal, and for adjusting transmission power of the second transceiver for transmitting the second signal based on power information provided in the another power confirmation signal,
   a first connector connected to the first transceiver for inputting the power verification signal into the housing or for outputting the power confirmation signal from the housing; and
   a second connector connected to the second transceiver for inputting the power confirmation signal into the housing or for outputting the power verification signal from the housing.

12. The pluggable electronic unit with transmission power adjustment capability of claim 11, wherein the housing is of standardized dimensions corresponding to one of the following: small form-factor pluggable (SFP) transceiver; SFP+, 10 Gigabit SFP, X2, Xenpak, GPON SFP, CFP or any other type of small form-factor pluggable related standard.

13. The pluggable electronic unit with transmission power adjustment capability of claim 11, wherein the first and second transceivers each comprise a corresponding connector.

14. The power regulated pluggable electronic unit of claim 11, wherein the at least one characteristic of the power verification signal consists of at least one of the following: a bit-error rate, power strength, and distance of link, reflection, attenuation, light chromatic dispersion, light polarization attenuation, light polarization dispersion, signal to noise ratio, or any other characteristic indicative of the quality of the power verification signal.

15. The pluggable electronic unit with transmission power adjustment capability of claim 14, wherein each of the connector consists of one of the following: optical connector, coaxial connector, electrical connector or an antenna.

16. The pluggable electronic unit with transmission power adjustment capability of claim 1, comprising:
   outputting the power confirmation signal for adjusting a power level of another pluggable electronic unit.

17. The pluggable electronic unit with transmission power adjustment capability of claim 7, comprising:
   inputting the power confirmation signal for receiving a power command from another pluggable electronic unit.

18. The pluggable electronic unit with transmission power adjustment capability of claim 11, comprising:
   outputting the power confirmation signal at the first connector for adjusting a power level of another pluggable electronic unit; and
   inputting the power confirmation signal at the second connector for receiving a power command from yet another pluggable electronic unit.

* * * * *